(12) United States Patent
Shimada

(10) Patent No.: US 6,202,826 B1
(45) Date of Patent: Mar. 20, 2001

(54) APPARATUS FOR FEEDING CHIP COMPONENTS

(75) Inventor: Katsumi Shimada, Kasukabe (JP)

(73) Assignee: Pop Man Corporation, Kasukabe (JP)

(*) Notice: Subject to any disclaimer, the term of this patent is extended or adjusted under 35 U.S.C. 154(b) by 0 days.

(21) Appl. No.: 09/252,220

(22) Filed: Feb. 18, 1999

(51) Int. Cl.[7] .................................................. B65G 47/14

(52) U.S. Cl. ............................................................ 198/396

(58) Field of Search ................................... 198/396, 443, 198/383

(56) References Cited

U.S. PATENT DOCUMENTS

| | | | |
|---|---|---|---|
| 4,469,709 | * | 9/1984 | Schrauf .............................. 198/396 X |
| 5,636,725 | * | 6/1997 | Saito et al. ............................ 198/396 |
| 5,836,437 | * | 11/1998 | Saito et al. ............................ 198/396 |
| 5,934,505 | * | 8/1999 | Shimada ............................ 198/396 X |
| 6,032,783 | * | 3/2000 | Saito et al. ........................ 198/396 X |

FOREIGN PATENT DOCUMENTS 9-13008   1/1997  (JP).

* cited by examiner

Primary Examiner—James R. Bidwell
(74) Attorney, Agent, or Firm—Jacobson, Price, Holman & Stern, PLLC

(57) ABSTRACT

An apparatus for feeding chip components is disclosed. The apparatus includes a first component reservoir for storing chip components in bulk, a second component reservoir for two-dimensionally storing the chip components in a space so that the chip components are not overlapped in their thickness direction, and a component alignment path for one-dimensionally aligning the chip components. The apparatus further includes an alignment plate for moving the chip components from the first component reservoir to the component alignment path thorough the second component reservoir by the upward and downward movements of the alignment plate. The apparatus further includes a movable plate, which moves in a predetermined direction when the chip components are caught or drawn between itself and the alignment plate, and a roller device for feeding the chip components in the component alignment path to a predetermined position.

8 Claims, 5 Drawing Sheets

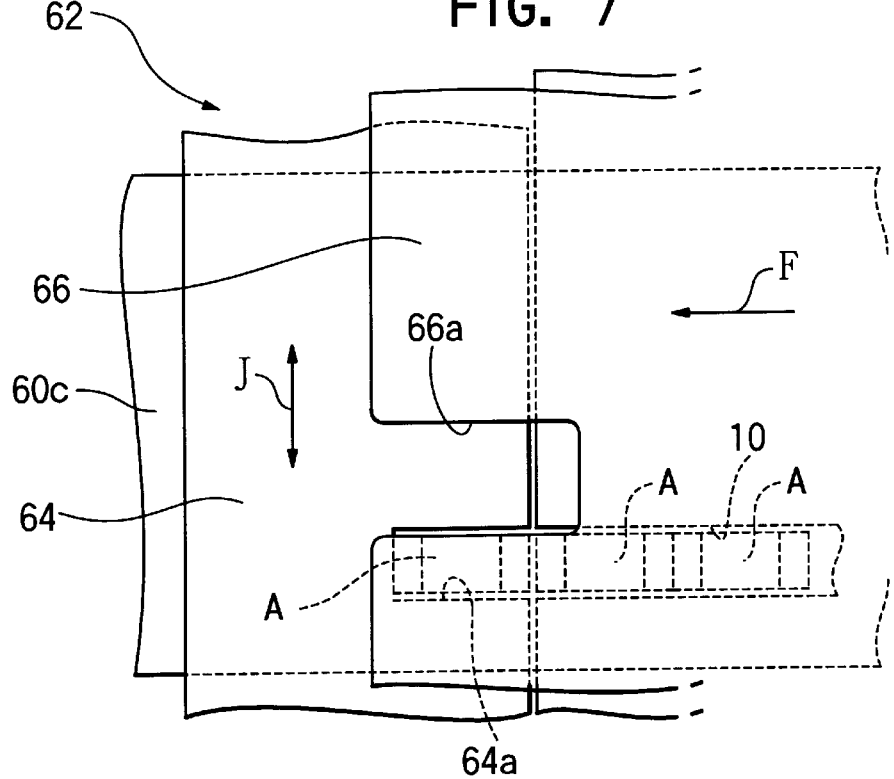
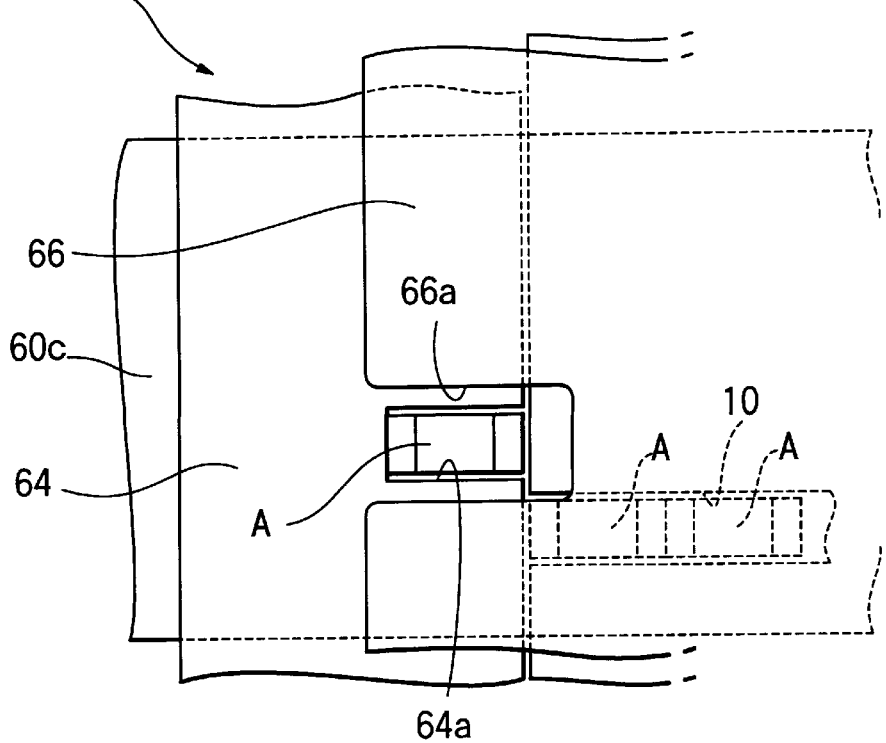

APPARATUS FOR FEEDING CHIP COMPONENTS

BACKGROUND OF THE INVENTION

1. Field of the Invention

The present invention relates an apparatus for feeding chip components, and in particular to an apparatus for feeding chip components in bulk while aligning such components in a line.

2. Description of the Related Art

Various kinds of chip components are mounted on a print circuit board. An automatic mounting device transfers such chip components to the print circuit board and then mounts the chip components on the board.

Japanese Patent Laid-Open No. 9-130088 discloses a chip component feeding apparatus. The chip component feeding apparatus feeds chip components in bulk while aligning such chip components in a line along a predetermined direction. According to the conventional chip component feeding apparatus, the chip components in bulk contained in a cartridge are introduced into a first component reservoir and then introduced into a second component reservoir by an up-and-down movement of a guide plate disposed between the first and second reservoirs. In the apparatus, an operator operates an operation lever to actuate the guide plate. The second component reservoir communicates with the first chip component and has a thickness which corresponds to that of the chip component so as to contain the components in a predetermined attitude thereof. Then, the chip components in the second reservoirs move down along a component guide groove by their own weight with keeping the predetermined attitude so that the components align in the guide groove in a line.

The chip components generally need to be fed out with their largest surfaces being facing upward so that the largest surfaces of the components are vacuumed and the components are picked up. On the other hand, in the conventional feeding apparatus explained above, the second reservoir is disposed in the same direction as the component feeding direction. Therefore, in the case that the component guide groove of the apparatus feeds the components, whose cross sections are rectangular, from the second reservoir to the picking up position, the component guide groove is designed to change the attitudes of the components by 90 degrees while twisting the attitudes of the components by 90 degrees. As a result, the largest surfaces of the components to be picked up face upward at the picking up position.

The conventional chip component feeding apparatus has following problems. As explained above, since the component guide groove needs to twist the attitudes of the components by 90 degrees when feeding the components to the picking up position, a very complicate groove machining process is required and the cost of the guide groove therefore becomes high.

In the conventional apparatus, the guide plate agitates the chip components in the first reservoir by the upper end surface thereof and guides the components into the second reservoir. The guide plate therefore needs to have a large vertical stroke and a large width so as to introduce enough amounts of the chip components into the second reservoir. As a result, when the guide plate moves upward, the chip components might be caught between the guide plate and the wall of the first reservoir and/or between the guide plate and the wall of the second reservoir. Similarly, when the guide plate moves downward, the chip components might be drawn between the guide plate and the wall of the first reservoir and/or between the guide plate and the wall of the second reservoir. In such cases, the chip components might be broken and further the guide plate and the first and second reservoirs might be damaged. Moreover, the guide plate might not work.

SUMMARY OF THE INVENTION

It is therefore an object of the present invention to provide an apparatus for feeding chip components which can surely and effectively feed chip components in bulk.

It is another object of the present invention to provide an apparatus for feeding smoothly chip components without the chip components being caught and/or drawn.

It is still another object of the present invention to provide a low cost chip feeding apparatus in which the attitudes of the chip components are not necessary to be twisted by 90 degrees.

It is still another object of the present invention to provide an apparatus for feeding chip component which can feed many components and has a relatively simple structure.

The above object is achieved according to the present invention by providing an apparatus for feeding chip components comprising a first component reservoir for storing chip components in bulk, the first component reservoir having a declined bottom portion on which the chip components move down by their own weight, a second component reservoir, provided under the first component reservoir, for two-dimensionally storing the chip components in a space which is defined so that the chip components are not overlapped in their thickness direction, the second component reservoir having a declined bottom portion on which the chip components move down by their own weight, a component alignment path, provided under the second component reservoir, for one-dimensionally aligning the chip components, the component alignment path having a cross section which corresponds to the cross section of the chip component, first alignment means, provided between the first component reservoir and the second component reservoir, for two-dimensionally aligning the chip components and letting the chip components move down by their own weight, second alignment means, provided between the second component reservoir and the component alignment path, for one-dimensionally aligning the chip components and letting the chip components move down by their own weight, movable plate means, provided adjacent to at least one of the first alignment means and the second alignment means, which moves in a predetermined direction when the chip components are caught or drawn between itself and at least one of the first alignment means and the second alignment means, and means for feeding the chip components in the component alignment path to a predetermined position.

In a preferred embodiment of the present invention, the movable plate means includes at least one of a first movable plate provided near the second alignment means in the second component reservoir, a second movable plate provided on the side portion of the first alignment means, and third movable plate provided on the back portion of the first alignment means.

In another embodiment of the present invention, the first alignment means and second alignment means are an integrally formed alignment plate, the alignment plate having two vertically movable wall members and a declined groove provided between the wall members, the declined groove forming a space in which the chip components are not overlapped in their thickness direction, the alignment plate two-dimensionally aligning the chip components in the declined groove when the alignment plate moves upward into the first component reservoir, the groove together with the wall members aligning the chip components in a line by the upward movement of the plate so that the chip components fall down by their own weight.

In another embodiment of the present invention, the second component reservoir is provided along a surface which is perpendicular to the feeding direction of the chip component feeding means, and the component alignment path changes the attitudes of the chip components from the vertical direction to the horizontal direction by about 90 degrees without twisting the attitudes of the chip components and aligns the chip components with their largest surfaces facing upward.

The above and other objects and features of the present invention will be apparent from the following description by taking reference with accompanying drawings employed for preferred embodiments of the present invention.

BRIEF DESCRIPTION OF THE DRAWINGS

In the accompanying drawings:

FIG. 7 is a partial plan view showing a component separating operation (at a component receiving position) at a front end of a roller device; and FIG. 8 is a partial plan view showing a component separating operation (at a component picking up position) at a front end of a roller device.

DETAILED DESCRIPTION OF THE PREFERRED EMBODIMENTS

Hereinafter, the preferred embodiments of the present invention will be explained with reference to the drawings.

Figure 1:
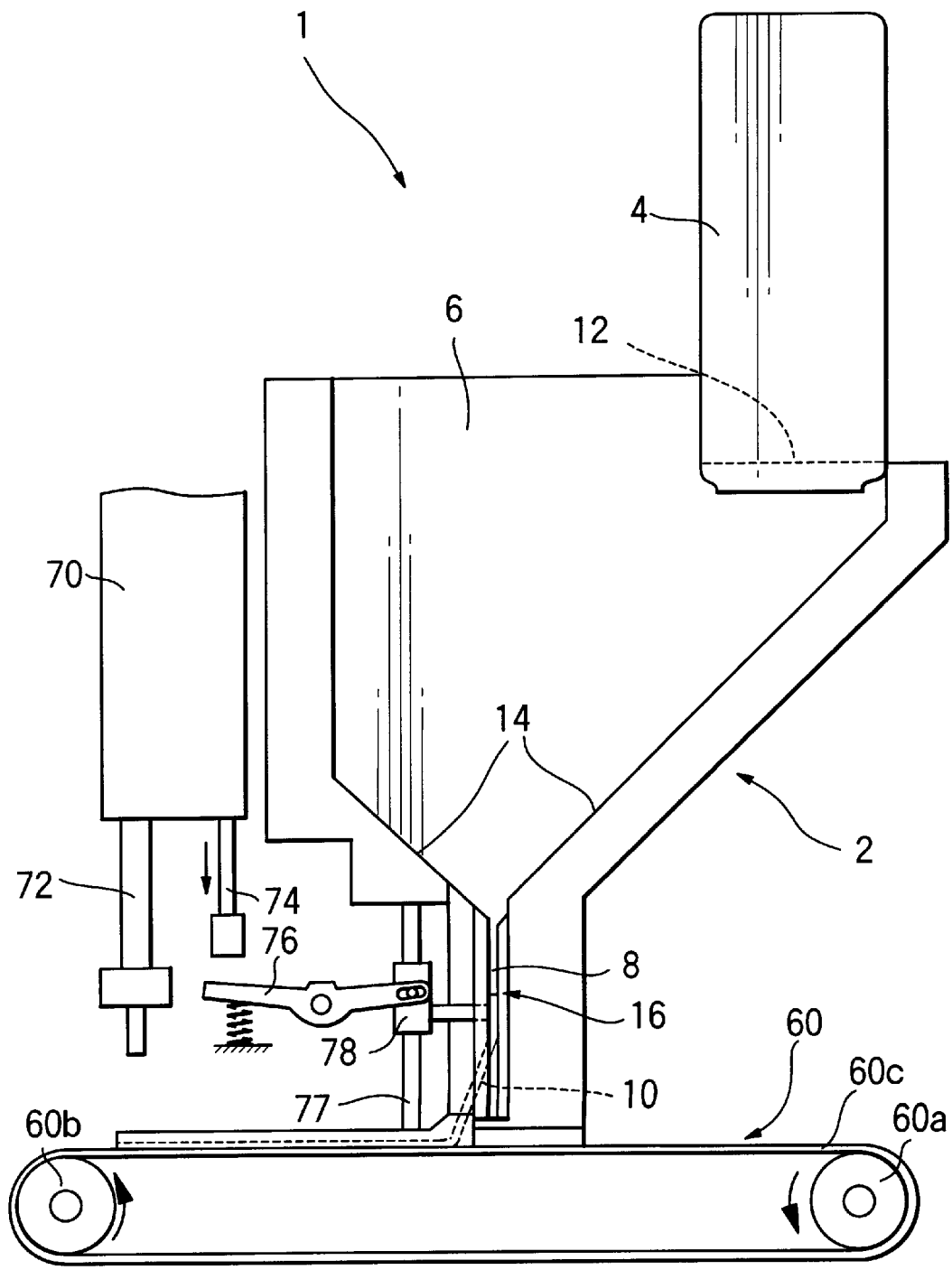
FIG. 1 is a front view showing a chip component feeding apparatus according to an embodiment of the present invention.
Figure 2:
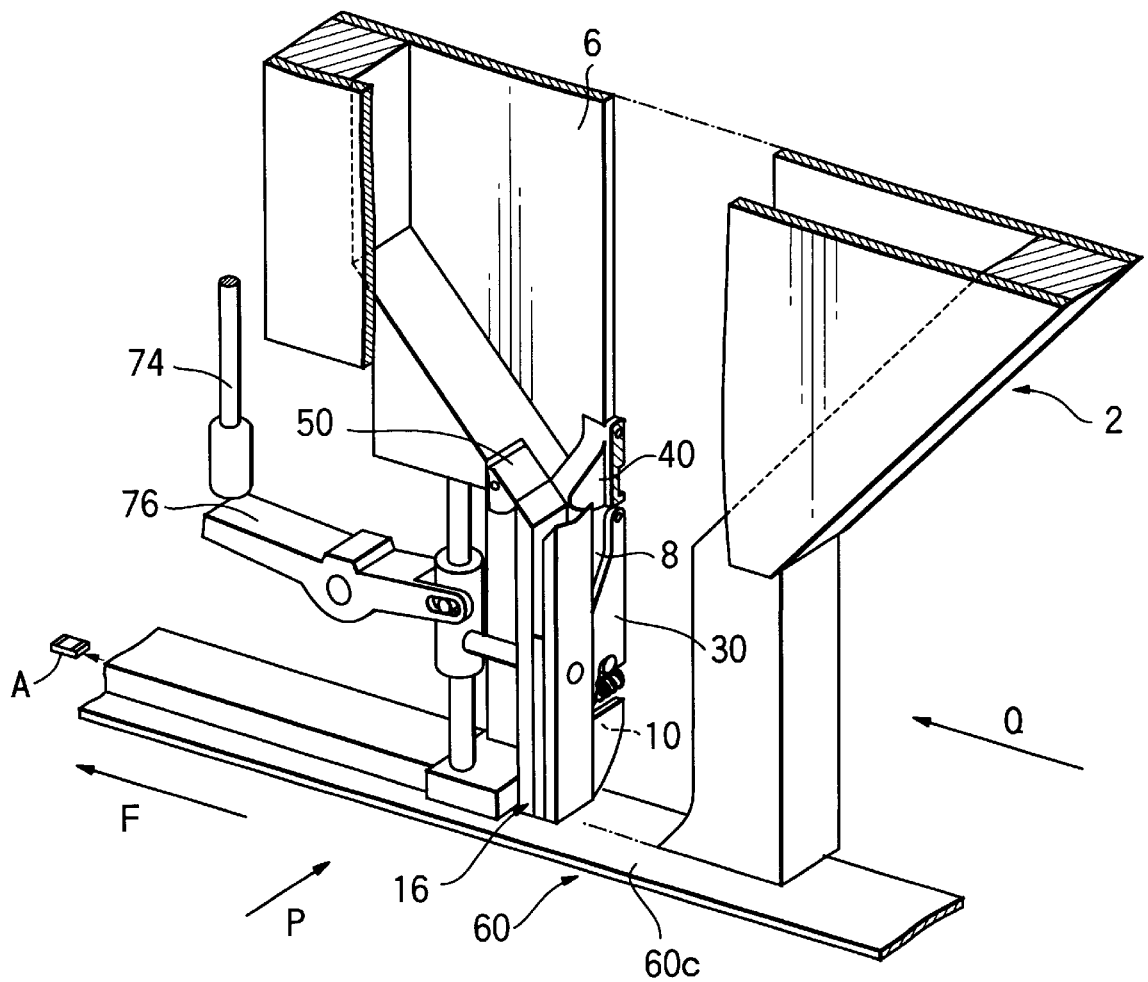
FIG. 2 is a partially developed perspective view of FIG. 1.
Figure 3:
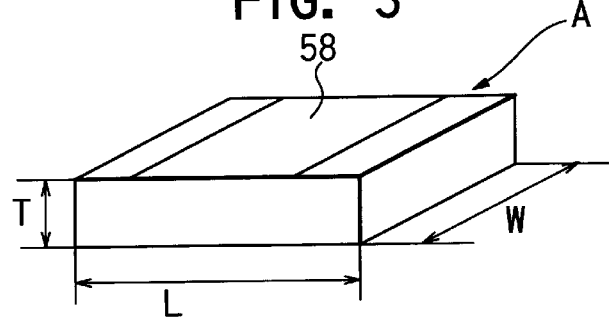
FIG. 3 is a perspective view showing an example of a chip component.

Referring to FIGS. 1 and 2, a reference numeral 1 designates a chip component feeding apparatus according to a preferred embodiment of the present invention. The chip component feeding apparatus 1 is provided with a housing 2. A chip component container 4 contains many chip components A, such as thousands to tens of thousands, in bulk. As the chip container 4, for example, a bulk case for surface mounting devices explained in "EIAJ ET-7201" of the Standard of Electronic Industries Association of Japan (EIAJ) is commercially available. Examples of the chip component A are chip capacitors having, for example, a length (L=1.0 mm), a width (W=0.5 mm) and a thickness (T=0.5 mm) and chip resistors having, for example, a length (L=1.6 mm), a width (W=0.8 mm) and a thickness (T=0.45 mm). The chip capacitors are explained in "EIAJ RC-2322" and the chip resistors are explained in "EIAJ RC-2130". FIG. 3 shows a chip resistor as an example of the chip component A. Other types of chip components may be used.

Referring to FIGS. 1 and 2, the chip component container 4 is attached to an upper opening of the housing 2. The chip component feeding apparatus 1 further includes a first component reservoir 6, a second component reservoir 8 and a component alignment path 10. The first component reservoir 6 is provided to three-dimensionally store the chip components in bulk. The second component reservoir 8 is located under the first reservoir along the side surface of the housing 2 to two-dimensionally store the chip components in a space which is defined so that the chip components are not overlapped in their thickness direction. The component alignment path 10 is located under the second reservoir 8 along the front surface of the housing 2 to one-dimensionally align the chip components. The component alignment path 10 is formed so as to correspond to the shape of the cross section of the chip component.

More specifically, the second reservoir 8 is formed along the side surface of the housing 2, which is perpendicular to the component feeding direction F (see FIG. 2). The thickness G (see FIG. 4) of the second reservoir 8 corresponds to the thickness T of the chip component A shown in FIG. 3. The thickness T of the chip component A is defined as the smallest one among the length L, the width W and the thickness T in FIG. 3.

When the chip component container 4 is attached to the upper opening of the housing 2, many chip components A in the container 4 are supplied into the first component reservoir 6. The container 4 may be continued to be attached on the housing 2 as shown in FIG. 2 or may be removed from the housing 2 after the components are supplied into the first reservoir 6.

The bottom surface 14 of the first component reservoir 6 is constructed to be declined so that the chip components A slip down by their own weight.

Figure 4A:
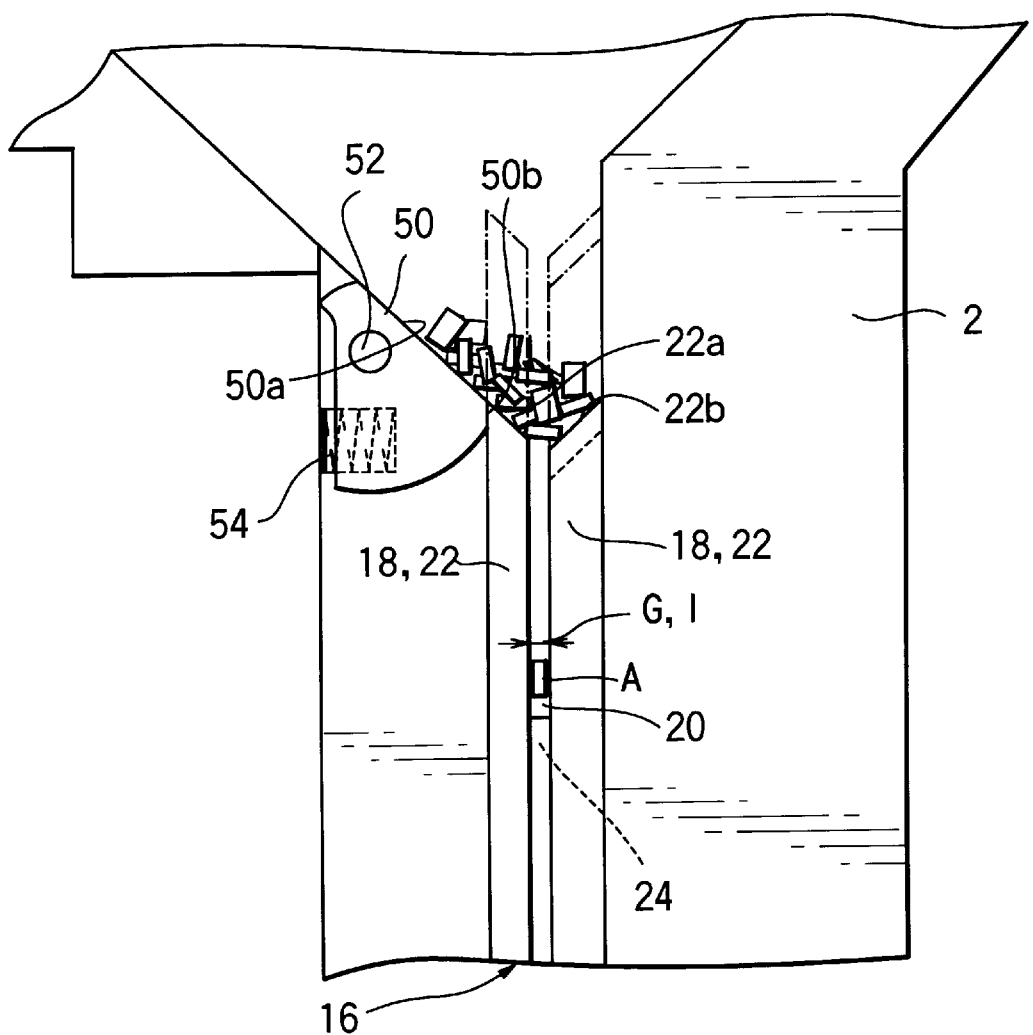
FIG. 4a is a partial sectional view seen from a P direction in FIG. 2.
Figure 4B:
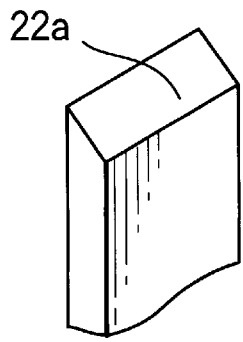
FIGS. 4b and 4c are partial perspective views respectively showing a first alignment portion of an alignment plate.
Figure 4C:
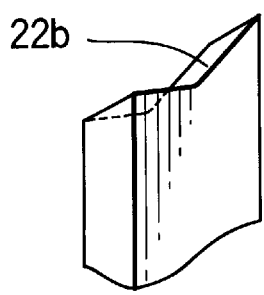

An alignment plate 16 is disposed so as to move up and down in the space which is defined, along the surface perpendicular to the feeding direction F, by the first reservoir 6, the second reservoir 8 and the component alignment path 10. The alignment plate 16 is provided with a first alignment portion 18 and a second alignment portion 20. The first alignment portion 18 includes two wall members 22 which are spaced apart along the component feeding direction thereof through a predetermined space. As shown in FIG. 4, a declined surface 22a (see FIG. 4b) is formed on the upper end of the left side wall member 22, and a declined recess surface 22b (see FIG. 4c) is formed on the upper end of the right side wall member 22. The upper ends of the right and left wall members 22 may have different configurations such as convex surfaces. The second alignment portion 20 includes a declined groove 24 which is formed between the two wall members 22 and is declined so that the chip components can slip down thereon by their own weight. The thickness I of the declined groove 24 is as same as the thickness G of the second component reservoir 8, and the declined groove 24 also works as a portion of the second reservoir 8. Alternate long and short dash lines in FIG. 4 show the location of the alignment plate 16 which has moved up to its highest position. Solid lines in FIG. 4 show the location of the alignment plate 16 which has moved down to its lowest position.

Referring to FIGS. 2, 4, 5 and 6, a first movable plate 30 is disposed at the right side (in FIG. 5) in the second component reservoir 8 so as to pivot on a supporting shaft 32. The first movable plate 30 is provided with a declined surface 30a, facing the second reservoir 8, which is declined so that the chip components can slip down thereon by their own weight. The first movable plate 30 is further provided with a straight surface 30b, facing the alignment plate 16, which defines a portion of the component alignment path 10 together with the alignment plate 16. A spring 34 is disposed at a lower end of the first movable plate 30 so as to bias the first movable plate 30 to a clockwise direction in FIG. 5. A stopper 36 is disposed so as to hold the first movable plate 30 at a predetermined location when the spring 34 biases the plate 30.

Figure 5:
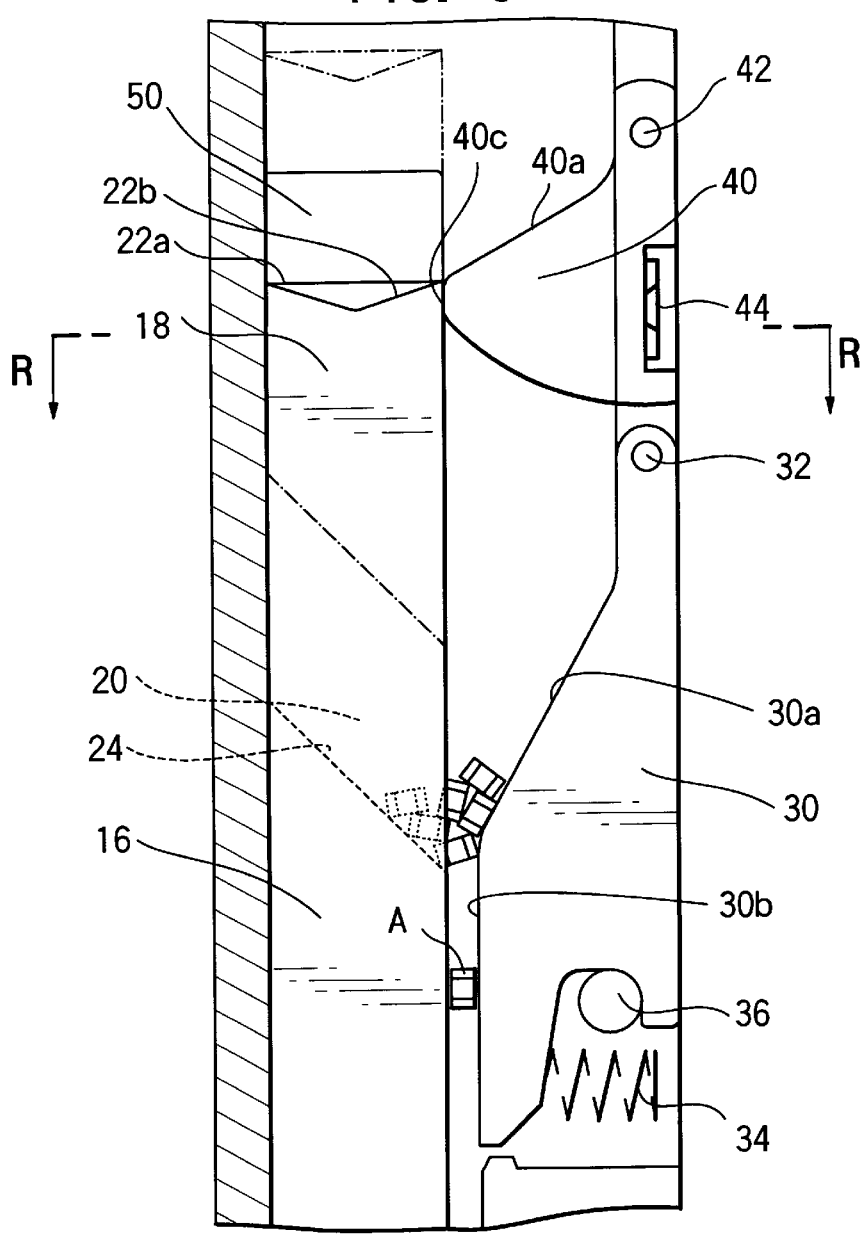
FIG. 5 is a partial side view seen from a Q direction in FIG. 2.
Figure 6:
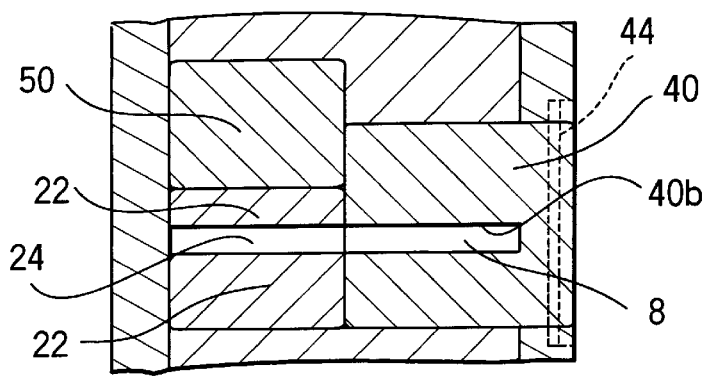
FIG. 6 is a sectional view as taken along a line R—R in FIG. 5.

Referring to FIGS. 2, 5 and 6, a second movable plate 40 is disposed under the first component reservoir 6 and at the right side of the alignment plate 16 (in FIGS. 5 and 6) so as to pivot on a supporting shaft 42. A plate spring 44 is disposed at a lower right side portion of the second movable plate 40 so as to bias the second movable plate 40 to a clockwise direction in FIG. 5. The second movable plate 40 is provided with a declined surface 40a, facing the first reservoir 6, which is declined so that the chip components can slip down thereon by their own weight. The second movable plate 40 is provided with vertical surfaces 40b, facing the second component reservoir 8, which define a portion of the second component reservoir 8. The second movable plate 40 is further provided with a left side end 40c which contacts with the alignment plate 16 by the biasing force of the spring 44. Thus, the alignment plate 16 works as a stopper of the second movable plate 40.

Referring to FIGS. 2, 4 and 6, a third movable plate 50 is disposed under the first component reservoir 6 and at the back side of the alignment plate 16 (in FIGS. 4 and 6) so as to pivot on a supporting shaft 52. A spring 54 is disposed at a lower left side portion of the third movable plate 50 so as to bias the third movable plate 50 to a counterclockwise direction in FIG. 4. The third movable plate 50 is provided with a declined surface 50a, facing the first reservoir 6, which is declined so that the chip components can slip down thereon by their own weight. The declined surface 50a of the third movable plate 50 is continuously connected with the declined surface 22a of the left wall member 22 of the alignment plate 16 when the alignment plate 16 has moved down to its lowest position. The third movable plate 50 is further provided with a right side end 50b which contacts with the alignment plate 16 by the biasing force of the spring 54. Thus, the alignment plate 16 works as a stopper of the third movable plate 50.

Referring back to FIG. 1, the component alignment path 10 is disposed within the housing 2 and is curved by about 90 degrees. The component alignment path 10 simply changes the attitude of the chip component from the vertical direction to the horizontal direction by being curved by about 90 degrees without twisting the attitude of the chip component along the feeding direction F. At the front end of the component alignment path 10, the chip component A is aligned with the largest surface 58 thereof facing upward (see FIG. 3).

A roller device 60 for conveying the chip components along the feeding direction F is disposed in the downstream portion of the component alignment path 10. The roller device 60 is composed of a non-driven roller 60a disposed at the right-hand side in FIG. 1, a driven roller 60b disposed at the left-hand side and a conveyer belt 60c connected with these rollers 60a and 60b for conveying the chip components A.

The conveyer belt 60c is generally made out of non-magnetic material. However, the conveyer belt 60c may be made out of magnetic material having a magnet function. In this case, powder having a magnetic property may be mixed with the belt, or a film having a magnetic property may be adhered to the belt.

Referring to FIGS. 7 and 8, a component separation device 62, which separates each component from the other chip components and moves the separated chip component to an outside at a predetermined timing, is disposed on the front end of the conveyer belt 60c of the roller device 60. The component separation device 62 is composed of a stopper member 64 and an upper cover member 66. The stopper member 64 stops the chip component, which is conveyed by the conveyer belt 60c, at the front end of the conveyer belt 60c. The stopper member 64 then separates the conveyed chip component from the following chip components by moving the conveyed chip component along the direction J which is perpendicular to the feeding direction F. The upper cover member 66 prevents the chip components from dropping out from the component alignment path 10. The stopper member 64 is provided with a recess portion 64a which can accept only one chip component. The stopper member 64 is movable along the direction J which is perpendicular to the feeding direction F. The upper cover member 66 is provided with a window portion 66a from which the chip component can be picked up when the stopper member 66 has moved horizontally the chip component to the location shown in FIG. 8. FIG. 7 shows the position at which the stopper member 64 receives the chip component, and FIG. 8 shows the position at which the chip component is picked up.

Referring back to FIG. 1, an automatic mounting device 70 is disposed at the chip component supply side of the chip component feeding apparatus 1. The automatic mounting device 70 is provided with a nozzle 72 for individually picking up the chip components. The automatic mounting device 70 is further provided with an actuator arm 74. A lever member 76 is disposed below the actuator arm 74. The lever member 76 is connected with a drive member 78, movable up and down along a guide shaft 77, one portion of which is connected with the alignment plate 16. The other portion of the drive member 78 is connected with the driven roller 60b of the roller device 60 and the stopper member 64 of the component separation device 62. Thus, the alignment plate 16, the driven roller 60b and the stopper member 64 are driven at a predetermined timing which is synchronized with an up and down movement of the automatic mounting device 70 for picking up the chip components. As a result, the chip component is moved to the picking up position and picked up at the predetermined timing.

In the embodiment, the alignment plate 16, the driven roller 60b and the stopper member 64 may be driven by a drive source, including a motor, an air cylinder or the like, disposed in the housing 2.

In operation, many chip components A in bulk contained in the component container 4 are supplied into the first reservoir 6. The chip components three-dimensionally stored in bulk in the first reservoir 6 slip down by their own weight along the bottom portion 14. The chip components then fall down into the second reservoir 8 through the declined surfaces 22a and 22b of the first alignment portion 18 (or wall members 22) and the declined groove 24 of the second alignment portion 20 (see FIGS. 4 and 5). At this time, some of the chip components A smoothly fall down directly from the first reservoir 6 to the second reservoir 8. However, at this time, in the first reservoir 6, there are a first group of the chip components A, which is aligned along the bottom portion 14 and is about to fall down by their own weight. There is further a second group of the chip components A, which is about to fall down from the declined surfaces 22a and 22b of the first alignment portion 18 of the alignment plate 16. Both first and second groups of the chip components are sometimes excessively concentrated at the downward portion of the bottom portion 14, and, as a result, the first group of the chip components can not fall down into the second reservoir 8. According to the embodiment of the present invention, the excessively concentrated chip components are forced to be set free by the upward motion of the wall members 22 of the alignment plate 16. As a result, the excessive concentration of the chip components is resolved. At this time, the chip components on the declined surfaces 22a and 22b and the side areas of the wall members 22 are smoothly introduced into the declined groove 24 between the two wall members 22 and slip down into the second reservoir 8 by their own weight. Thus, the chip components A are two-dimensionally stored in the second reservoir 6 under the condition that the chip components A are not overlapped in their thickness direction.

Thereafter, the alignment plate 16 moves downward. Such upward and downward motions of the alignment plate 16 are repeated at the predetermined timing.

When the chip components A move from the first reservoir 6 to the second reservoir 8, since the alignment plate 16 moves up and down, some further problems occurs. Namely, the chip components might be caught between the side portion of the first alignment portion 18 and the first reservoir 6 when the plate 16 is moving upward. Further, the chip components might be drawn between the side portion of the first alignment portion 18 and the first reservoir 6 when the plate 16 is moving down. When the chip components are thus caught or drawn, the chip components themselves are broken, and/or the alignment plate 16 and the second movable plate 40 are damaged. According to the embodiment, when such problems occurs, the second movable plate 40 pivots on the supporting shaft 42 in a counterclockwise direction (in FIG. 5) against the biasing force of the spring 44 so as to go away from the side portion of the alignment plate 16. As a result, a larger space is formed between the side portion of the alignment plate 16 and the first reservoir 6, the chip components can be surely prohibited from being caught or drawn.

Similarly, when the chip components A move from the first reservoir 6 to the second reservoir 8, since the alignment plate 16 moves up and down, some further problems occurs. Namely, the chip components might be caught between the back portion of the first alignment portion 18 and the first reservoir 6 when the plate 16 is moving upward. Further, the chip components might be drawn between the back portion of the first alignment portion 18 and the first reservoir 6 when the plate 16 is moving down. When the chip components are thus caught or drawn, the chip components themselves are broken, and/or the alignment plate 16 and the third movable plate 50 are damaged. According to the embodiment, when such problems occurs, the second movable plate 50 pivots on the supporting shaft 52 in a clockwise direction (in FIG. 4) against the biasing force of the spring 54 so as to go away from the back portion of the alignment path 16. As a result, a larger space is formed between the back portion of the alignment plate 16 and the first reservoir 6, the chip components can be surely prohibited from being caught and drawn.

The chip components A stored in the second reservoir 8 slip down along the declined groove 24 of the second alignment portion 20 and the declined surface 30a of the first movable plate 30 by their own weight toward the component alignment path 10. At this time, there are a first group of the chip components A, which is aligned on the declined groove 24 of the second alignment portion 20 and is about to slip down by their own weight. There is further a second group of the chip components A, which is aligned on the declined surface 30a of the first movable plate 30 and is about to slip down by their own weight from the declined surface 30a. Both first and second groups of the chip components are sometimes excessively concentrated near the inlet of the component alignment path 10, and, as a result, the chip components can not fall down into the component alignment path 10. According to the embodiment, the excessively concentrated chip components are forced to be set free by the upward motion of the declined groove 24 of the alignment plate 16. As a result, the excessive concentration of the chip components generated near the inlet of the component alignment path 10 is resolved. At this time, the chip components are again aligned on the declined surface 30a of the first movable plate 30 and slip down by their own weight toward the component alignment path 10. Thereafter, the alignment plate 16 moves downward.

When the chip components A move from the second reservoir 8 to the component alignment path 10, since the alignment plate 16 moves up and down, some further problems occurs. Namely, the chip components might be caught between the alignment plate 16 and the straight portion 30b of the first movable plate 30 when the plate 16 is moving upward. Further, the chip components might be drawn between the alignment plate 16 and the straight portion 30b of the first movable plate 30 when the plate 16 is moving down. When the chip components are thus caught or drawn, the chip components themselves are broken, and/or the alignment plate 16 and the first movable plate 30 are damaged. According to the embodiment, when such problems occurs, the first movable plate 30 pivots on the supporting shaft 32 in a counterclockwise direction (in FIG. 5) against the biasing force of the spring 34 so as to go away from the alignment path 16. As a result, a larger space is formed between the alignment plate 16 and the straight portion 30b of the first movable plate 30, the chip components can be surely prohibited from being caught or drawn.

Next, the chip components A thus introduced into the component alignment path 10 fall down by their own weight to the roller device 60. At this time, the components A simply change their attitudes from the vertical direction to the horizontal direction by 90 degrees without twisting their attitudes along the feeding direction. At the front end of the roller device 60, the chip component A is aligned with its largest surface 58 (see FIG. 3) facing upward.

The chip components A are conveyed along the feeding direction F by the conveyor belt 60c of the roller device 60 and are stopped by contacting with the groove portion 64a of the stopper member 64 (see FIG. 7). At this time, both the stopped component and the following chip components are slipping on the conveyor belt 60c.

After the groove portion 64a of the stopper member 64 surely receives the chip component A, the stopper member 64 horizontally moves a predetermined distance in the direction J which is perpendicular to the feeding direction F of the conveyor belt 60s as shown in FIG. 8. Thus, the chip component A in the groove portion 64a is separated from the following chip components by the horizontal movement of the stopper member 64. As a result, the pressure onto the chip component A in the groove portion 64a, applied by the following chip components, is released and therefore the chip component A in the groove 64a is easily picked up.

Further, the cover member 66 prevents the chip components A from dropping out from the component alignment path 10. The chip component A are individually picked up thorough the window 66a of the cover member 66 by the nozzle 72 of the automatic mounting device 70.

Although the present invention has been explained with reference to specific, preferred embodiments, one of ordinary skill in the art will recognize that modifications and improvements can be made while remaining within the scope and spirit of the present invention. The scope of the present invention is determined solely by appended claims.

What is claimed is:

1. An apparatus for feeding chip components comprising:
   a first component reservoir for storing chip components in bulk, the first component reservoir having a declined bottom portion on which the chip components move down by their own weight;
   a second component reservoir, provided under the first component reservoir, for two-dimensionally storing the chip components in a space which is defined so that the chip components are not overlapped in their thickness direction, the second component reservoir having a declined bottom portion on which the chip components move down by their own weight;
   a component alignment path, provided under the second component reservoir, for one-dimensionally aligning the chip components, the component alignment path having a cross section which corresponds to the cross section of the chip component;
   first alignment means, provided between the first component reservoir and the second component reservoir, for two-dimensionally aligning the chip components and letting the chip components move down by their own weight;
   second alignment means, provided between the second component reservoir and the component alignment path, for one-dimensionally aligning the chip components and letting the chip components move down by their own weight;
   movable plate means, provided adjacent to at least one of the first alignment means and the second alignment means, which moves in a predetermined direction when the chip components are caught or drawn between itself and at least one of the first alignment means and the second alignment means, said movable plate means including at least one of a first movable plate provided near the second alignment means in the second component reservoir, a second movable plate provided on the side portion of the first alignment means, and a third movable plate provided on the back portion of the first alignment means; and
   means for feeding the chip components in the component alignment path to a predetermined position.

2. An apparatus according to claim 1, wherein said second component reservoir is provided along a surface which is perpendicular to the feeding direction of the chip component feeding means, the component alignment path changes the attitudes of the chip components from the vertical direction to the horizontal direction by about 90 degrees without twisting the attitudes of the chip components and aligns the chip components with their largest surfaces facing upward.

3. An apparatus according to claim 1, wherein said first alignment means and second alignment means are an integrally formed alignment plate, the alignment plate having two vertically movable wall members and a declined groove provided between the wall members, the declined groove forming a space in which the chip components are not overlapped in their thickness direction, the alignment plate two-dimensionally aligning the chip components in the declined groove when the alignment plate moves upward into the first component reservoir, the groove together with the wall members aligning the chip components in a line by the upward movement of the plate so that the chip components fall down by their weight.

4. An apparatus according to claim 1, wherein said second component reservoir is provided along a surface which is perpendicular to the feeding direction of the chip component feeding means, and the component alignment path changes the attitudes of the chip components from the vertical direction to the horizontal direction by about 90 degrees without twisting the attitudes of the chip components and aligns the chip components with their largest surfaces facing upward.

5. An apparatus according to claim 1, wherein said chip component feeding means includes a component conveyor belt which feeds the chip components in a predetermined direction, a stopper member, provided at the front end of the component conveyor belt, which receive only one chip component and separates the one chip component from following chip components by moving in a horizontal direction which is perpendicular to the feeding direction, and a cover member, provided on the stopper member, which includes a window through which the one chip component is picked out.

6. An apparatus according to claim 1, wherein said chip component feeding means includes a component conveyor belt which feeds the chip components in a predetermined direction, the component conveyor belt being made out of magnetic material.

7. An apparatus for feeding chip components comprising:
   a first component reservoir for storing chip components in bulk, the first component reservoir having a declined bottom portion on which the chip components move down by their own weight;
   a second component reservoir, provided under the first component reservoir, for two-dimensionally storing the chip components in a space which is defined so that the chip components are not overlapped in their thickness direction, the second component reservoir having a declined bottom portion on which the chip components move down by their own weight;
   a component alignment path, provided under the second component reservoir, for one-dimensionally aligning the chip components, the component alignment path having a cross section which corresponds to the cross section of the chip component;
   an alignment plate which is provided to be movable upward and downward in a space which communicates with the first component reservoir, the second component reservoir and the component alignment path, the alignment plate having two vertically movable wall members and a declined groove provided between the wall members, the declined groove forming a space in which the chip components are not overlapped in their thickness direction, the alignment plate two-dimensionally aligning the chip components in the declined groove when the alignment plate moves upward into the first component reservoir, the groove together with the wall members aligning the chip components in a line by the upward movement of the plate so that the chip components fall down by their own weight.

8. An apparatus for feeding the chip components comprising:
   a first component reservoir for storing chip components in bulk;

a second component reservoir, provided so as to communicate with the first component reservoir, for two-dimensionally storing the chip components in a space which is defined so that the chip components are not overlapped in their thickness direction;

a component alignment path, provided so as to communicate with the second component reservoir, for one-dimensionally aligning the chip components, the component alignment path having a cross section which corresponds to the cross section of the chip component;

first alignment means, provided between the first component reservoir and the second component reservoir, for two-dimensionally aligning the chip components and moving the chip components from the first component reservoir to the second component reservoir;

second alignment means, provided between the second component reservoir and the component alignment path, for one-dimensionally aligning the chip components and moving the chip components from the second reservoir to the component alignment path;

movable plate means, provided adjacent to at least one of the first alignment means and the second alignment means, which moves in a predetermined direction when the chip components are caught or drawn between itself and at least one of the first alignment means and the second alignment means, said movable plate means including at least one of a first movable plate provided near the second alignment means in the second component reservoir, a second movable plate provided on the side portion of the first alignment means, and a third movable plate provided on the back portion of the first alignment means; and means for feeding the chip components in the component alignment path to a predetermined position.

* * * * *